US005498899A

United States Patent [19]
Palara

[11] Patent Number: 5,498,899
[45] Date of Patent: Mar. 12, 1996

[54] SPIRAL RESISTOR INTEGRATED ON A SEMICONDUCTOR SUBSTRATE

[75] Inventor: Sergio Palara, Acitrezza, Italy

[73] Assignee: Co.Ri.M.Me., Catania, Italy

[21] Appl. No.: 287,109

[22] Filed: Aug. 8, 1994

Related U.S. Application Data

[63] Continuation of Ser. No. 67,666, May 26, 1993, abandoned.

[30] Foreign Application Priority Data

May 28, 1992 [EP] European Pat. Off. ............ 92830271

[51] Int. Cl.$^6$ ................................................. H01L 29/00
[52] U.S. Cl. ..................... 257/536; 257/488; 257/489; 257/577
[58] Field of Search .................... 257/488, 489, 257/536, 577

[56] References Cited

U.S. PATENT DOCUMENTS

| 4,423,433 | 12/1983 | Imaizumi et al. | 257/536 |
| 4,792,840 | 12/1988 | Nadd | 257/536 |
| 5,053,743 | 10/1991 | Mille et al. | 257/379 |

FOREIGN PATENT DOCUMENTS

| 0077072 | 4/1983 | European Pat. Off. . |
| 0240435 | 10/1987 | European Pat. Off. . |

OTHER PUBLICATIONS

Patent Abstracts of Japan, vol. 6, No. 12 (E-91) (890) Jan. 23, 1982, and JP-A-56 133 863 (Citizen Tokei K.K.) Oct. 20, 1981.

*Primary Examiner*—J. Carroll
*Attorney, Agent, or Firm*—David V. Carlson; Clarence T. Tegreene; Seed and Berry

[57] ABSTRACT

A spiral resistor being of a type formed on a semiconductor substrate to withstand high voltages, comprises at least one thin field-plate layer covering said substrate between adjacent turns of the resistor. This prevents the well-known phenomenon of the "phantom gate" from occurring which would result in the characteristics of spiral resistors deteriorating over time.

12 Claims, 4 Drawing Sheets

5,498,899

SPIRAL RESISTOR INTEGRATED ON A SEMICONDUCTOR SUBSTRATE

CROSS-REFERENCE TO RELATED APPLICATION

This application is a continuation of U.S. patent application Ser. No. 08/067,666, filed May 26, 1993, now abandoned.

TECHNICAL FIELD

This invention relates to a spiral resistor of a type formed on a semiconductor substrate to withstand high voltages.

BACKGROUND OF THE INVENTION

In the specific field of application of this invention, it is common practice to provide high-voltage resistors with a horizontal geometry which is essentially spiral-shaped and formed on a semiconductor substrate having a predetermined, opposite polarity from that of the resistor.

One such construction is known, for instance, from U.S. Pat. No. 4,792,840 and allows the resistor to so distribute the equipotential lines across the substrate surface as to hold the difference of potential at the junction points between the resistor and the substrate surface below the junction breakdown voltage. The potential difference varies linearly toward the spiral center, which allows the resistor to withstand high voltages of up to 400 Volts.

While being beneficial from this point of view, said prior approach still has a serious drawback.

When any two regions of the resistor are taken which lie close to each other, i.e., regions of two adjacent turns or convolutions, one of them is bound to be at a lower potential than the other. As a result, the positive charges present in the oxide layer that covers the spiral will be pulled toward the metallic contact associated with the lower potential region.

The build-up of positive charges gradually forms a conductive layer proper, referred to in the art as "phantom layer," which extends toward the higher potential region.

This phantom layer, being additionally connected to a negative potential present at the metallic contact, establishes conduction between the aforesaid two and underlying regions at different potentials.

Briefly stated, the phantom layer functions as if it were the gate of a MOS transistor, with the two regions at different potentials corresponding to the source and drain of the transistor.

This reflects in deep alteration of the spiral resistor characteristics, and deterioration of its reliability.

SUMMARY OF THE INVENTION

According to principles of the present invention, a spiral resistor is provided of the type which has such constructional and performance characteristics as to overcome this serious drawback besetting the prior art.

Accordingly, it is an object of this invention to provide a spiral resistor which can retain its characteristics unaltered over time.

Another object of the invention is to provide a resistor which can be used as a high-voltage edge termination in an integrated power circuit.

According to principles of the present invention, the semiconductor layer is covered between turns of the resistor with a fieldplate layer.

Consistent with this inventive solution, the technical problem is solved by a resistor as indicated and defined, the invention being determined by the scope of the claims.

The features and advantages of a spiral resistor according to this invention will become apparent from the following detailed description of an embodiment thereof, given by way of example and not of limitation with reference to the accompanying drawings.

DETAILED DESCRIPTION OF THE INVENTION

Figure 1:
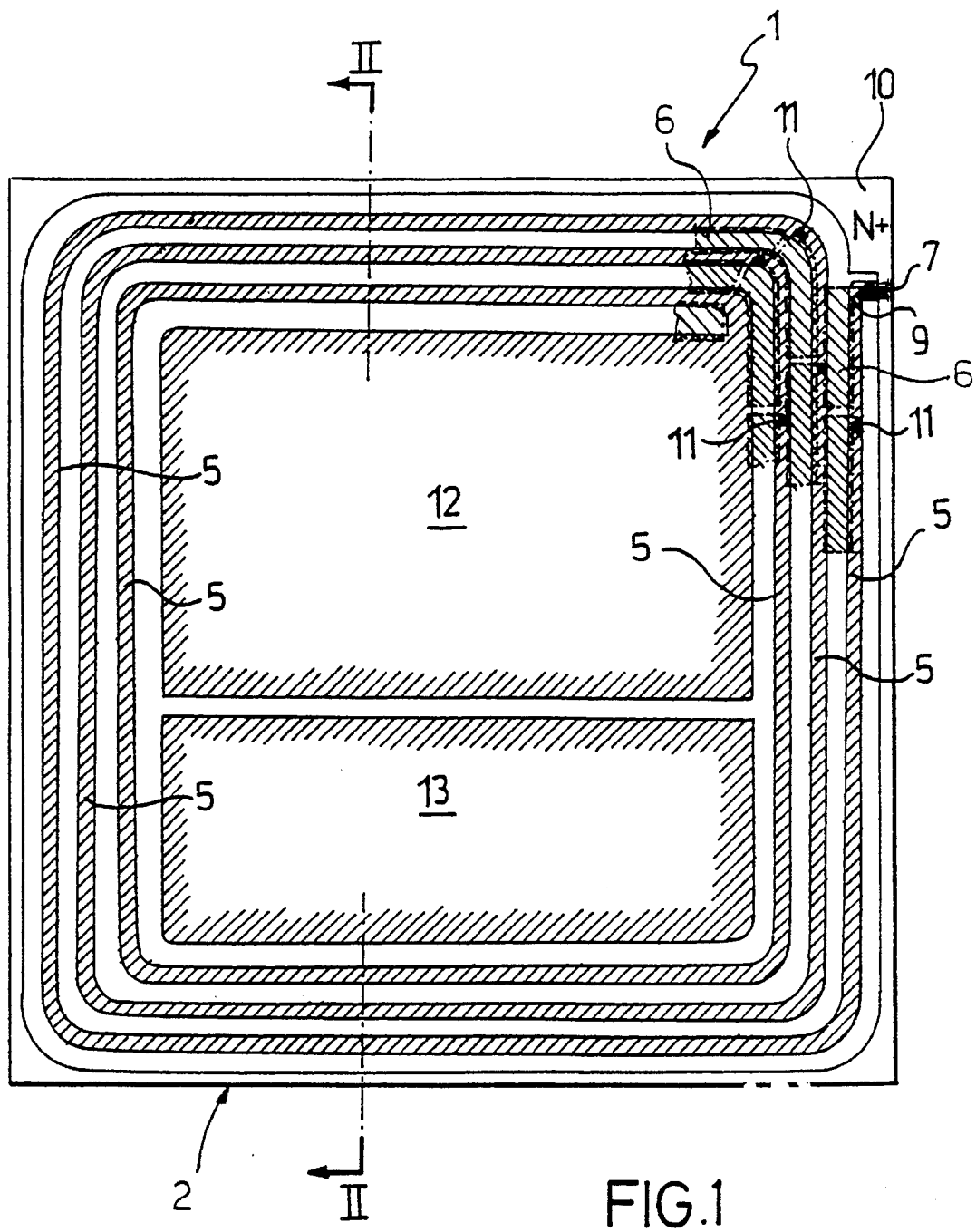
FIG. 1 is a top plan view showing schematically a spiral resistor according to the invention.

With reference to the drawing views, generally and schematically shown at 1 is a spiral resistor embodying this invention which is formed on a semiconductor silicon substrate 2 of an integrated circuit or chip.

The substrate 2 comprises a first base region 2A having predetermined conductivity, e.g., of the N+ type, and being covered with an epitaxial layer 3 of the N– type; the latter being conventionally covered and protected by an oxide layer 16.

The resistor 1 is formed on a substrate surface to provide an essentially spiral-pattern region comprising a predetermined number of turns 5 and being doped oppositely from the epitaxial layer 3, e.g., of the P+ type.

The spiral pattern may either be hyperbolic or "Archimedean"; it being in either case a region characterized by a reduced width with respect to its length effective to provide a desired resistance value.

This region 1 may be formed using conventional diffusion or implantation techniques so as to rise substantially to the surface of the epitaxial layer 3.

For convenience of illustration, the drawings show but a few of the turns 5, but their number may be a large one in actual practice.

The turns 5 are separated by portions 8 of the epitaxial layer 3 which ensure electric insulation thereof. Centrally on the spiral, there may be formed such electronic power devices as a control circuit 12 and a power transistor 13.

Such circuits may be enclosed in insulating pockets 14 normally connected to ground in accordance with known techniques.

The substrate 2 has an edge region 10 to which one end 9 of the resistor 1 is connected. The connection is provided by a metallization contact 7.

Figure 2:
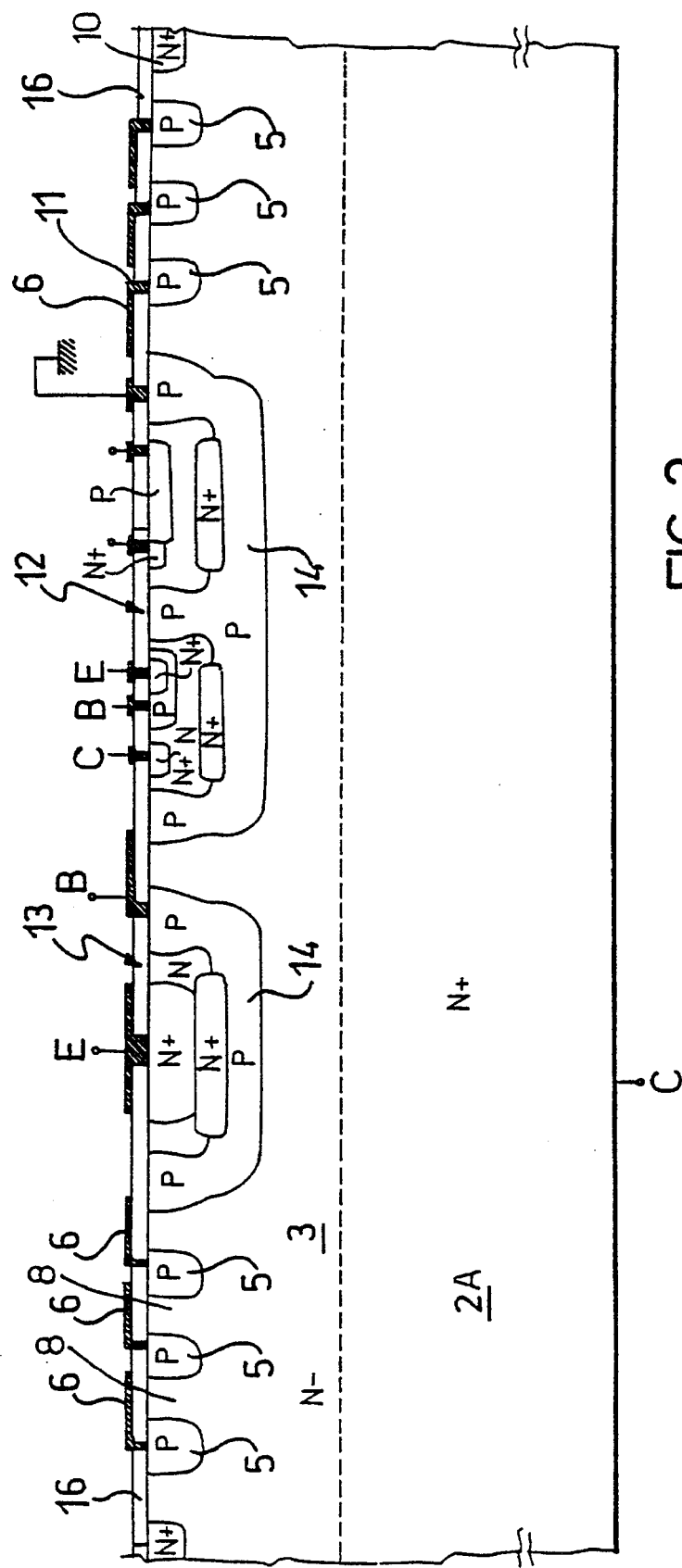
FIG. 2 is a schematic cross-sectional view taken through the resistor in FIG. 1 along line II—II.

Advantageously, according to the invention, there are deposited over the epitaxial layer 3 of the semiconductor thin metallization layers 6 of the fieldplate type which extend between adjacent turns 5 of the resistor 1. While the field plates 6 are shown extending only partially around the spiral resistor for clarity of presentation, it will be understood that the field plates 6 contact the spiral resistor around the entire circumference in a manner similar to that shown in FIGS. 1–3.

In essence, these fieldplate layers 6 cover the epitaxial N– regions 8 between two P+ regions of adjacent turns 5 preferably for the entire length of the resistor.

Figure 3:
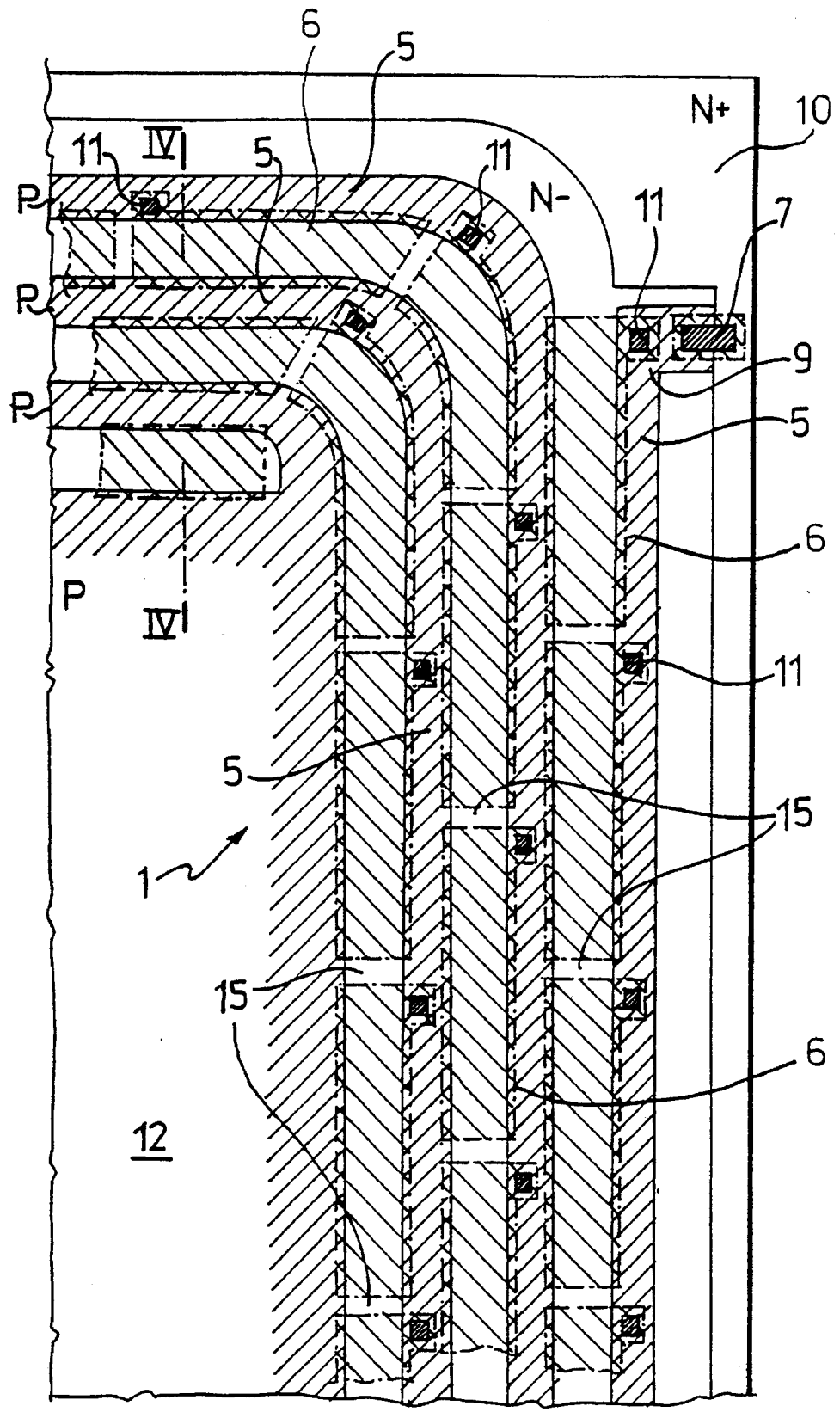
FIG. 3 is a schematic top plan view, drawn to an enlarged scale, of a detail of the spiral resistor according to the invention.
Figure 4:
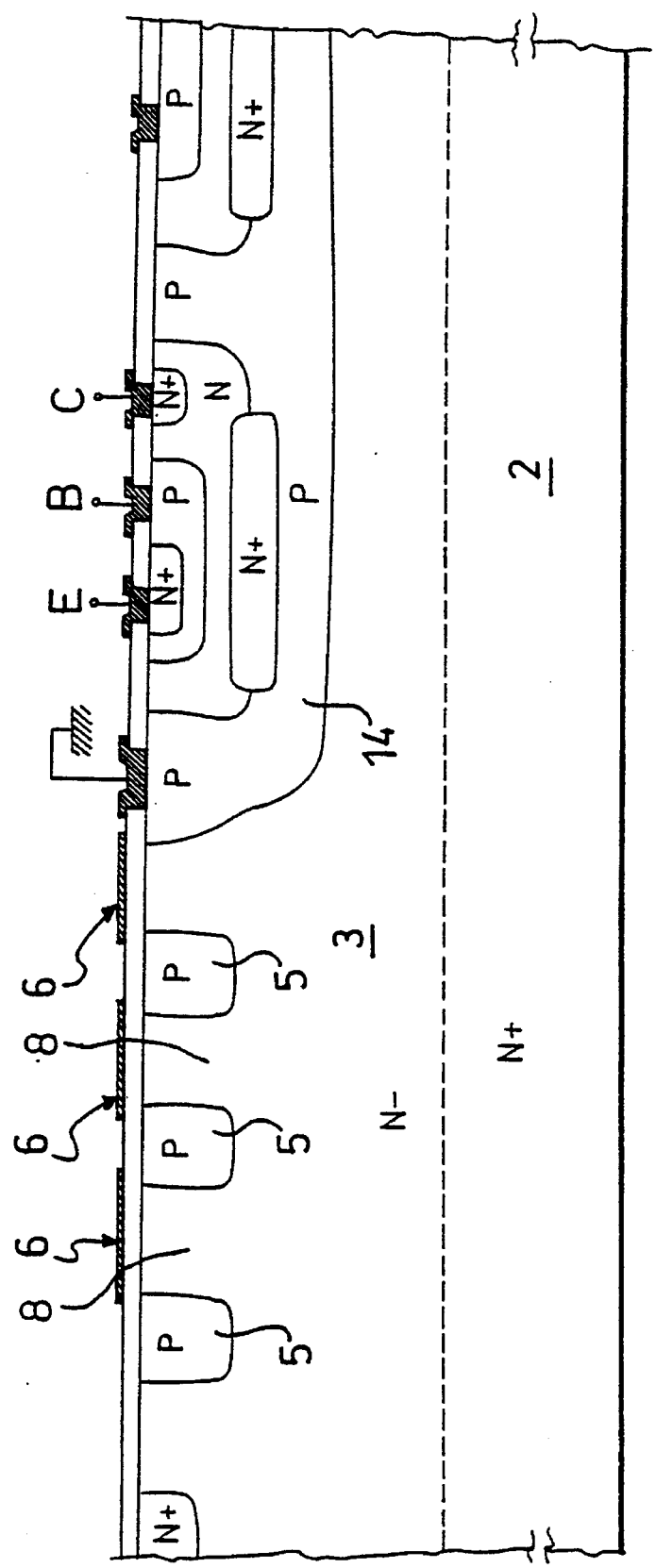
FIG. 4 is a cross-sectional side view, taken along line IV—IV, of the detail shown in FIG. 3.

With reference in particular to FIG. 3, it can be seen that, starting from the edge 10, whereto the end 9 of the resistor 1 is connected via contact 7. Contacts 11 are opened in the resistor turns 5 to which the metallic field-plates 6 are connected.

In order to have said field-plates 6 correctly polarized, the connection 11 is established on the higher potential one of two adjacent turns 5. Stated otherwise, when two adjacent P+ regions of two turns 5 are considered, the field-plate 6 that covers part of the epitaxial N– region extending between said P+ regions is connected to the higher electric potential region via the contact 11.

As previously mentioned, of two adjacent turns 5, the higher potential one is always the outward turn, that is the larger radius one.

The connection between a fieldplate layer 6 and a P+ region of a turn 5, using the contact 11, can be accomplished by placing the contact 11 at one end of the field-plate 6, as shown in FIG. 3.

It would be equally possible, however, to position the contact 11 at any other intermediate location on the thin layer 6.

It can be appreciated from the foregoing that the metallization layer 6 functions as the gate electrode of a P-channel MOS transistor having the two turns 5 for its source and drain electrodes. However, this is a shutdown transistor because of its gate being connected to the higher electric potential. Thus, the phenomenon known as "phantom gate" is effectively prevented from occurring by the metallic shielding provided by the field-plate 6.

Preferably, the fieldplate metallization 6 should be partialized, in the sense that its continuous connection to the higher potential (which would be that of the substrate) is not to be recommended.

In fact, a decrease in the radius of curvature and packing of the equipotential lines together at the surface would otherwise occur which result in the N-P junction breaking down at the lower potential turn in the spiral.

The field-plate metallizations 6 preferably are partialized into separate segments; the length of each individual metallic segment is selected to prevent the potential difference between the field-plate 6 and the P+ regions 5 of the two turns 5 from bringing about concentration of the equipotential lines at the surface of the epitaxial layer 3, which would actually bring about the aforesaid breakdown phenomenon.

Such dimensioning of selecting the length of each segment is determined, at least in part, by the number of the turns 5 in the spiral resistor 1, because the potential difference between one turn 5 and its adjacent one 5 decreases as the number of the turns 5 increases.

Therefore, a break, indicated at 15 in the drawings, has been suitably provided between successive field-plates 6 each being on a segment and a small portion 15 of the N– channel separating adjacent P+ regions will be left exposed by the metallization.

Since this exposed portion 15 could represent a weakness in the construction, the invention uniquely provides for these portions 15 left uncovered by the metallization to lie offset from one another, an example of which is shown in FIG. 3.

The inventive resistor 1 solves the technical problem and affords a number of advantages, of which the most important one is that the occurrence of the phantom gate phenomenon can be effectively prevented. The resistor 1 can retain its resistance characteristics unchanged over time is another distinct advantage.

I claim:

1. A semiconductor substrate structure comprising:

a semiconductor substrate having a plurality of resistive regions of a first conductivity type diffused therein, the resistive regions being adjacent each other and spaced from each other by a substrate region;

a first field-plate layer contacting a first of said resistive regions and extending from said first resistive region to cover substantially all of the substrate region between said first resistive region and a second of the resistive regions adjacent the first resistive region; and an electrical contact between said first resistive region and the first field-plate layer wherein said first field-plate overlaps a portion of said first resistive region, extends to completely cover the substrate region between the first and second resistive regions, and overlaps at least a portion of the second resistive region.

2. A resistor according to claim 1 wherein the first field plate layer covers an epitaxial region of the substrate.

3. A resistor according to claim 2, wherein the resistor includes a plurality of adjacent turns and said first field plate layer is connected electrically to one of the plurality of turns of the resistor.

4. A resistor according to claim 3, characterized in that said one turn is an outward one of the adjacent turns.

5. A resistor according to claim 1, characterized in that the electrical contact is provided by a conductor placed at an edge of said first field plate layer.

6. A resistor according to claim 1, characterized in that the first field plate layer has a length inversely proportional to the electric potential difference between the respective pair of turn sections.

7. The structure of claim 1 wherein the first resistive region is a first turn of a spiral region and the second resistive region is a second turn of a spiral resistive region, and wherein the first turn is at a higher electric potential than the second turn.

8. The structure according to claim 7 wherein said first field-plate layer overlaps a portion of said first resistive region, extends to completely cover the substrate region between the first and second resistive regions, and overlaps at least a portion of the second resistive region.

9. The structure of claim 1, further comprising a second field-plate layer located above the semiconductor substrate, each of the first and second field-plate layers covering a discrete area of an upper surface of the substrate and both being connected adjacent each other along the resistive region to provide two segments along the resistive region, the two segments having a gap between them.

10. The structure of claim 9 wherein the resistive regions form a spiral region having a plurality of turns, and wherein both of the field-plate layers are connected electrically to a single one of the turns.

11. The structure of claim 10 wherein the field-plate layers have a longitudinal dimension, said longitudinal dimension is proportional to an expected electric potential difference between a first turn and a second turn.

12. The structure of claim 10, further comprising:

a third field-plate layer and a fourth field-plate layer, said third and fourth field-plate layers covering a portion of the second turn, each of the third and fourth field-plate layers being connected electrically to the spiral region at the second turn and extending above the substrate to overlap a third turn, the third turn being adjacent to the second turn, the third and fourth field-plate layers each covering a discrete area of the upper surface and being adjacent each other along the second turn of the spiral region to provide two segments having a gap between the segments wherein the gap corresponding to the third and fourth field-plate layers is offset from the gap corresponding to the first and second field-plate layers.

* * * * *